United States Patent
Drabe et al.

(10) Patent No.: US 8,199,390 B2
(45) Date of Patent: Jun. 12, 2012

(54) METHOD FOR STRUCTURING A DEVICE LAYER OF A SUBSTRATE

(75) Inventors: Christian Drabe, Dresden (DE); Thomas Klose, Dresden (DE)

(73) Assignee: Fraunhofer-Gesellshaft zur Foerderung der Angewandten Forschung E.V., Munich (DE)

(*) Notice: Subject to any disclaimer, the term of this patent is extended or adjusted under 35 U.S.C. 154(b) by 440 days.

(21) Appl. No.: 12/479,503

(22) Filed: Jun. 5, 2009

(65) Prior Publication Data
US 2009/0303563 A1 Dec. 10, 2009

(30) Foreign Application Priority Data
Jun. 5, 2008 (DE) .......................... 10 2008 026 886

(51) Int. Cl.
*G02B 26/08* (2006.01)
(52) U.S. Cl. .................................................. 359/214.1
(58) Field of Classification Search .... 359/223.1–226.1, 359/212.1–214.1, 298, 871
See application file for complete search history.

(56) References Cited

U.S. PATENT DOCUMENTS

| 6,511,913 | B1 | 1/2003 | Benzel et al. |
| 6,749,308 | B1 | 6/2004 | Niendorf et al. |
| 2003/0010745 | A1 | 1/2003 | Field |
| 2004/0259286 | A1* | 12/2004 | Dehe et al. ............... 438/50 |
| 2007/0154040 | A1* | 7/2007 | Chen ........................ 381/174 |
| 2007/0202628 | A1 | 8/2007 | Wuertz |
| 2009/0026561 | A1 | 1/2009 | Reichenbach et al. |

FOREIGN PATENT DOCUMENTS
WO WO2006/082155 8/2006

OTHER PUBLICATIONS
Office Action, mailed Feb. 28, 2011, in related Chinese Application No. 200910142676.3, 18 pages.

* cited by examiner

*Primary Examiner* — Euncha Cherry
(74) *Attorney, Agent, or Firm* — Michael A. Glenn; Glenn Patent Group

(57) ABSTRACT

Method for structuring a device layer of a substrate, wherein the substrate includes a carrier layer, the device layer and an intermediate layer disposed between the carrier layer and the device layer. Thereby, the intermediate layer is structured for exposing, at least in one portion, a first surface of the carrier layer facing the device layer. Starting from a second surface of the carrier layer opposing the first surface, the thickness of the device layer is reduced to a predetermined thickness at those positions where the intermediate layer is removed.

21 Claims, 15 Drawing Sheets

↓ 910

↓ 920

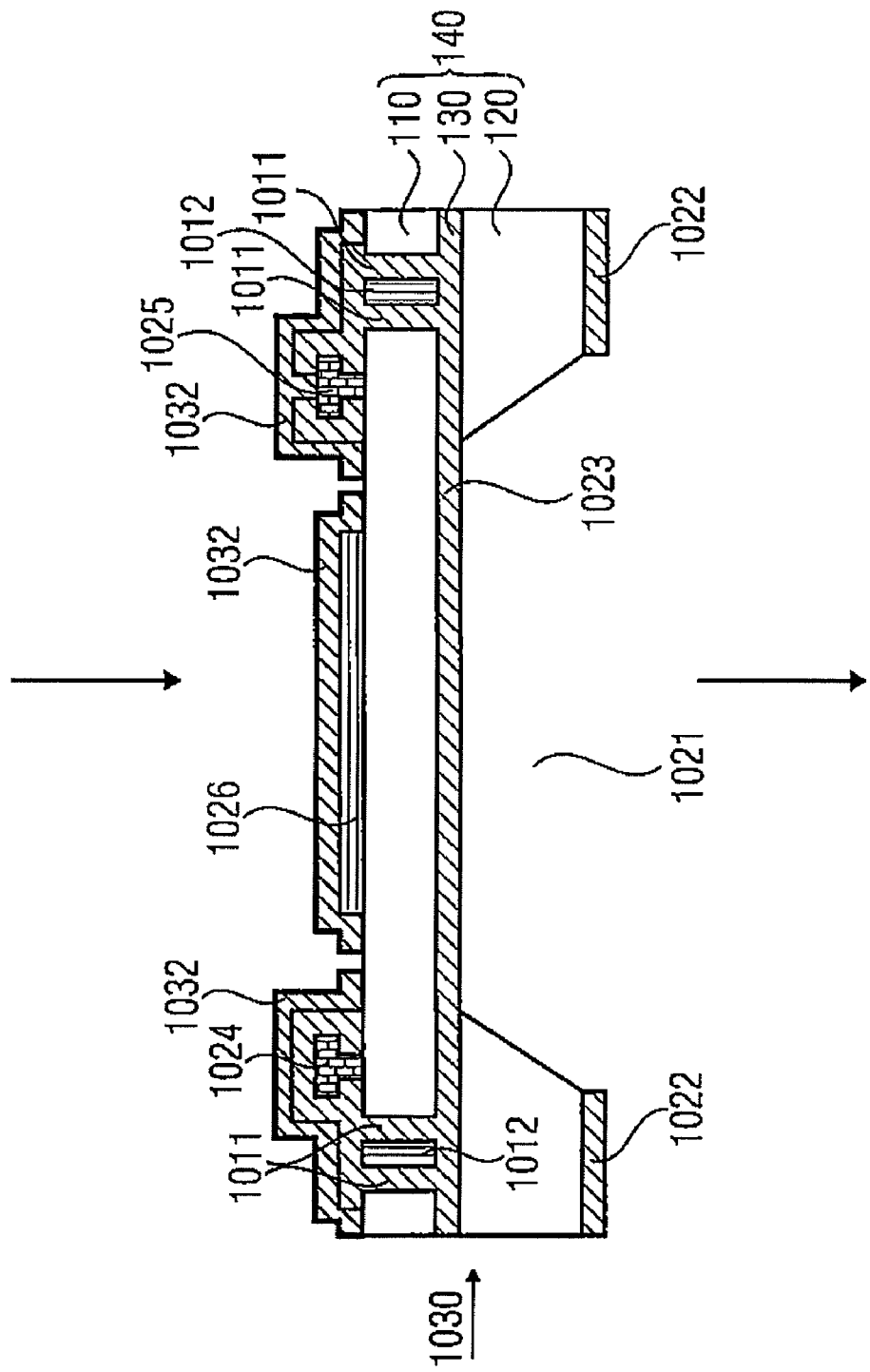

METHOD FOR STRUCTURING A DEVICE LAYER OF A SUBSTRATE

CROSS-REFERENCE TO RELATED APPLICATIONS

This application claims priority to German Patent Application No. 102008026886.0-54 filed on 5 Jun. 2008, which is incorporated herein by reference in its entirety.

BACKGROUND OF THE INVENTION

Embodiments according to the invention relate to a method for structuring a device layer of a substrate.

Several embodiments of the invention relate to a method for three-dimensional structuring of micromechanical structures.

Micromechanical devices, such as micro-optical devices, such as scanners, can be produced with volume micromechanical methods, for example on BSOI (bonded-silicon-on-insulator), wherein the devices are geometrically defined by "etching through" the device layer or device level, respectively, to a separation layer or intermediate layer, respectively, for example a BOX (buried oxide). The space below the actuators, where the carrier wafer or the carrier layer, respectively, is, is normally exposed for allowing unlimited vibration. In an "in-plane" arrangement of electrodes, for example, lateral electrodes can be used for exciting, for example, resonant micromechanical devices.

DE 199 63 382 A1 describes an example of a micromirror. A micromirror, in particular a micro vibration mirror with at least one largely cantilevered mirror surface is suggested, which is deflectable from the resting position by at least one torsion spring. Here, the mirror surface is connected to at least one support body by torsion beams guided at least approximately parallel to each other. Further, it is suggested to deflect the micromirror from its resting position via electrostatic or magnetic interaction.

FIGS. 9(A)-(C) show an example of a method 900 for producing a BSOI wafer. Here, in a first step 910, a carrier layer 120, which consists, for example, of silicon and has an oxide layer 130 at its surface, is connected to a device layer 110 having a thickness of 2 µm to 400 µm, which consists, for example, of silicon, which is shown in FIGS. 9(A) and 9(B). The oxide layer 130 on the surface of the carrier layer 120 serves as an intermediate layer 130 between the device layer 110 and the carrier layer 120. In this case, the intermediate layer 130 is also called BOX. In a second step 920, the device layer 110 is structured in its layer thickness and at its edges, which is shown in FIG. 9(C).

Further, FIGS. 10(A)-(D) show an example of a method 1000 for producing a micromechanical structure in or on a BSOI wafer, which is produced, for example, according to a method according to FIG. 9. In the method 1000, in a first step 1010, as shown in FIG. 10(A), isolating trenches are provided in the device layer 110. Therefore, it is necessitated to etch trenches into the silicon of the device layer 110, and to subsequently oxidize the walls of the trenches (as shown at reference number 1011) and to fill the trenches, for example with polysilicon 1012. This step is terminated by a planarizing CMP process (CMP: chemical-mechanical polishing) or etching back with plasma.

A second step 1020 as shown in FIG. 10(B) comprises generating and structuring a back-side mask 1022, generating and structuring conductive traces 1024 and bondpads 1025 (bondpads: pads for providing, for example, electric connections to other electronic devices), and generating and structuring, for example, a mirror 1026. Thereby the back-side mask is formed by a layer 1022 which is on the surface of the carrier layer 120 facing away from the device layer 110 and is removed at the positions where the carrier layer 120 is to be etched later.

By a third step 1030, as shown in FIG. 10(C), a front-side mask 1032 for structuring the micromechanical element is generated, the carrier layer 120 is removed at the positions 1021 defined by the back-side mask 1022, for example by TMAH (TMAH: tetramethylammonium hydroxide), and the intermediate layer 130 or the BOX is also removed at the positions 1023 where the carrier layer 120 has been removed.

A fourth step 1040, as shown in FIG. 10(D) comprises etching trenches 1042 into the device layer 110, wherein at the positions where trenches 1042 are generated, the device layer 110 is removed completely, and comprises subsequent removal of the front-side mask 1032. The trenches 1042 in the device layer 110 define the geometrical form of the micromechanical element.

Normally, the physical properties of these devices, such as natural frequency or mode splitting are defined by the geometry of the suspensions, such as length and width of the springs, in combination with the geometries of the vibration mass and can be adapted correspondingly, for example to the requirements of the respective application. However, for certain applications, the parametric space of these two dimensions is not sufficient for obtaining a satisfactory solution. Thus, there is basically the possibility of locally changing the thickness of the device layer. In other words, apart from the definition of the geometry in two dimensions, additionally, as a third dimension, the thickness of the device layer can be changed for adjusting the physical properties of the devices.

Several methods allow changing the thickness of the device layer by locally depositing and structuring thick layers, whereby the physical properties (e.g. the mass) can be changed. However, the long process times necessitated for depositing and etching are expensive. Additionally, large steps cause lithography problems.

Other methods generate stepping of an SOI layer (SOI: silicon-on-insulator) from the front, which causes a loss of planarity. This results, for example, in lithography problems, and resist spin-on is no longer easily possible. A two-stage etching process (etching the steps and exposing the device by means of etching, normally a plasma etching process) is expensive to control and implies double mask effort. If no mask residuals are to remain on the finished device layer of the device for avoiding layer tensions, the technology is difficult to realize with a double-resist mask.

Several methods generate stepping of the SOI layer from the backside, which also causes a loss of planarity with the same problems. When using a spray resist, only very coarse structures can be resolved and adjusting is imprecise. Additionally, focussing problems result when structuring in trenches. Also, handling the plates on the possibly previously processed and structured front side might cause damage of the already existing structures.

SUMMARY

An embodiment may have a method for structuring a device layer of a substrate, wherein the substrate has a carrier layer, the device layer and an intermediate layer disposed between the carrier layer and the device layer, and wherein the intermediate layer is structured for exposing, at least in one portion, a first surface of the carrier layer facing the device layer, wherein, starting from a second surface of the carrier layer opposing the first surface, the thickness of the device layer is reduced to a predetermined thickness at those positions where the intermediate layer is removed.

According to another embodiment, a method for producing a micromechanical structure may have the steps of: providing a substrate having a device layer, a carrier layer and an intermediate layer disposed between the device layer and the carrier layer, wherein the intermediate layer is structured for exposing, at least in one portion, a first surface of the carrier layer facing the device layer; and generating a micromechanical structure in the device layer of the substrate, wherein generating the micromechanical structure has reducing the thickness of the device layer to a predetermined thickness in at least one area of the micromechanical structure according to the inventive method for structuring a device layer of a substrate.

According to another embodiment, a micromechanical structure may have: a substrate having a device layer, a carrier layer and an intermediate layer disposed between the device layer and the carrier layer, wherein the intermediate layer is structured for exposing, at least in one portion, a first surface of the carrier layer facing the device layer; and at least one portion in the area of the micromechanical structure, wherein the thickness of the device layer is reduced according to the inventive method for structuring a device layer of a substrate.

One embodiment according to the invention provides a method for structuring a device layer of a substrate, wherein the substrate comprises a carrier layer, the device layer and an intermediate layer disposed between the carrier layer and the device layer. The intermediate layer is structured for exposing, at least in one portion, a first surface of the carrier layer facing the device layer. Starting from a second surface of the carrier layer opposing the first surface, the thickness of the device layer is reduced to a predetermined thickness at those positions where the intermediate layer is removed.

Embodiments of the invention are based on the central idea that the thickness of the device layer of a substrate is reduced from the side facing the carrier layer, wherein the "pre-structured" intermediate layer is implemented as a mask for reducing the thickness of the device layer. In this context, the term "pre-structured" intermediate layer means that the intermediate layer is already structured when producing the substrate. The device layer is thereby reduced exactly at those positions where the intermediate layer is removed, without necessitating further lithography steps.

Several embodiments according to the invention have the advantage that removing the carrier layer and reducing the thickness of the device layer can be performed in one processing step. Thereby, an expensive two-stage process is not necessitated.

In several embodiments according to the invention, the device layer comprises a stop layer integrated in the device layer or deposited on the device layer, which defines the predetermined thickness of the device layer. Thereby, the thickness of the device layer can be reduced to the predetermined thickness without necessitating expensive process controls during reduction.

BRIEF DESCRIPTION OF THE DRAWINGS

Embodiments of the present invention will be detailed subsequently referring to the appended drawings, in which:

FIGS. 10(A)-(D) is a schematic illustration of a method for producing a micromechanical structure in or on a BSOI wafer.

DETAILED DESCRIPTION OF THE INVENTION

Figure 1A:
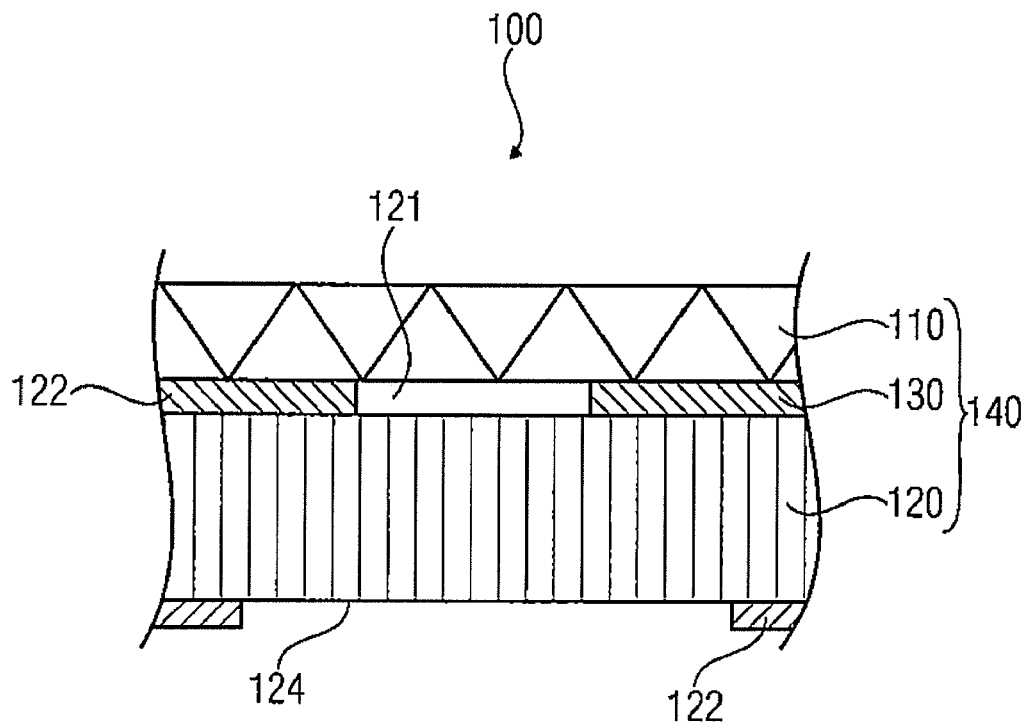
FIGS. 1(A)-(B) is a schematic illustration of a method for structuring a device layer of a substrate.
Figure 1B:
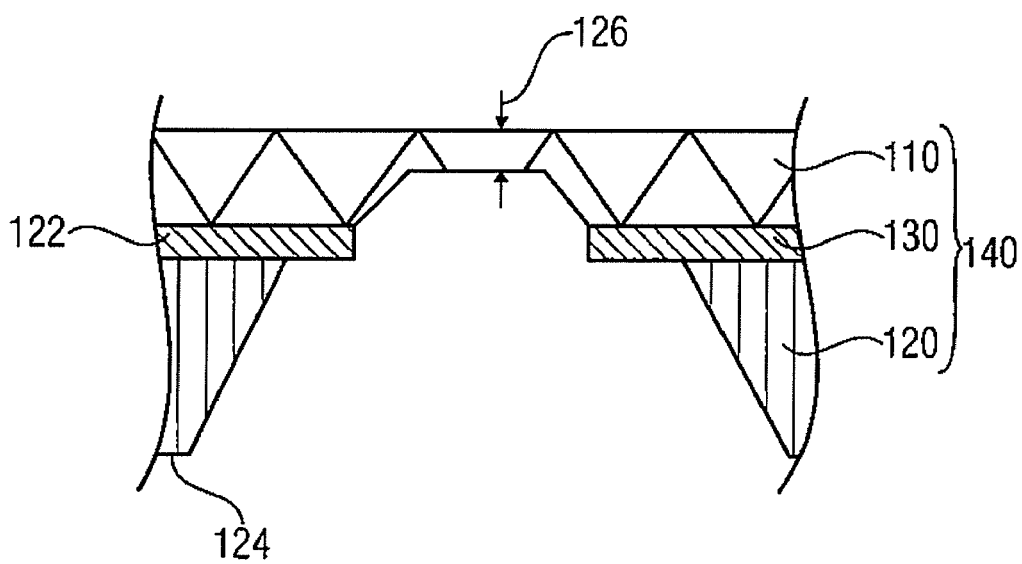
Figure 2A:
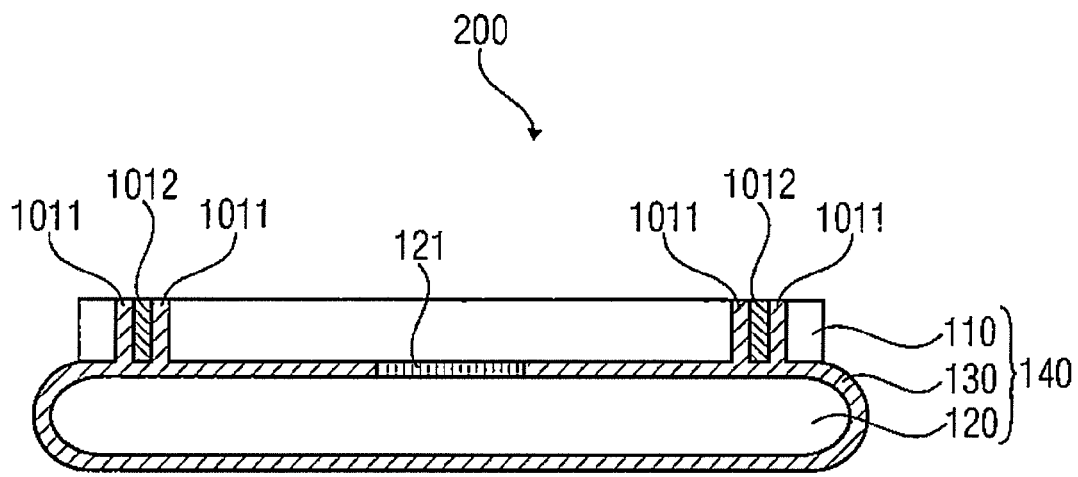
FIGS. 2(A)-(D) is a schematic illustration of a method for producing a micromechanical structure.
Figure 2B:
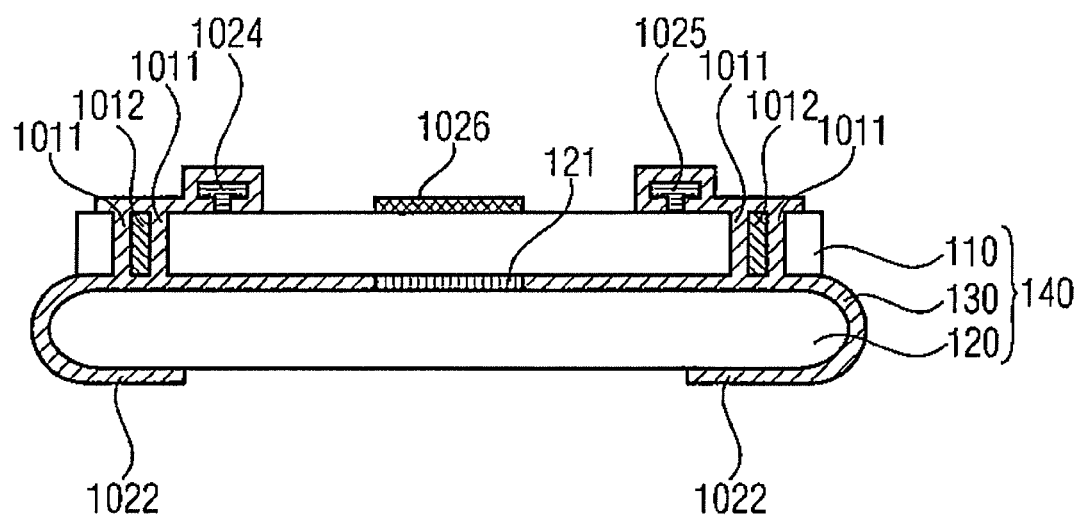
Figure 2C:
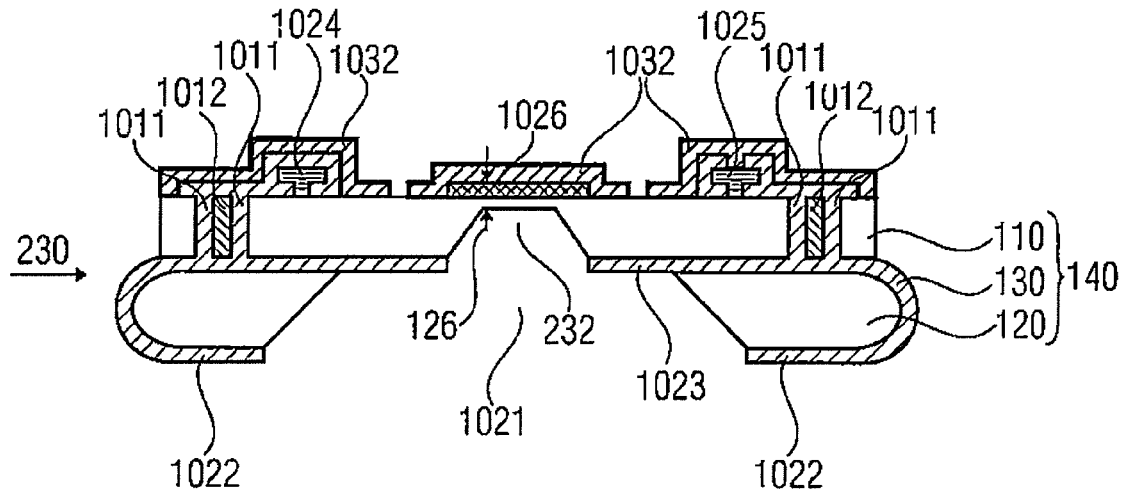
Figure 2D:
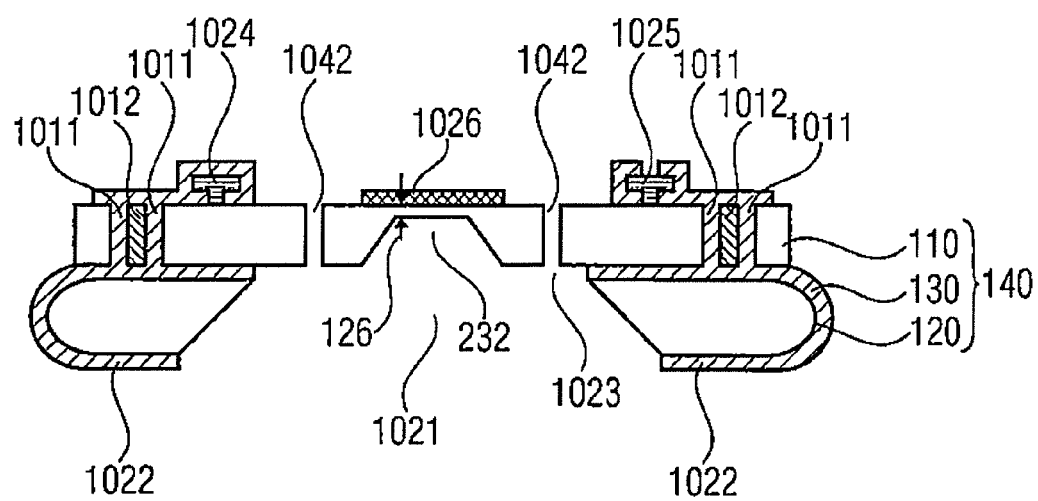
Figure 3A:
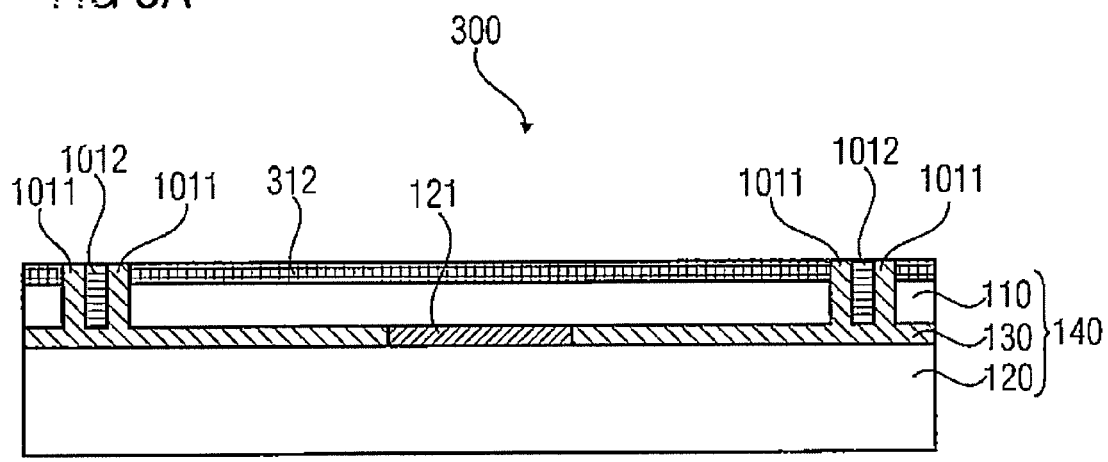
FIGS. 3(A)-(D) is a schematic illustration of a method for producing a micromechanical structure, wherein the device layer of the substrate comprises an integrated stop layer.
Figure 3A:
Figure 3B:
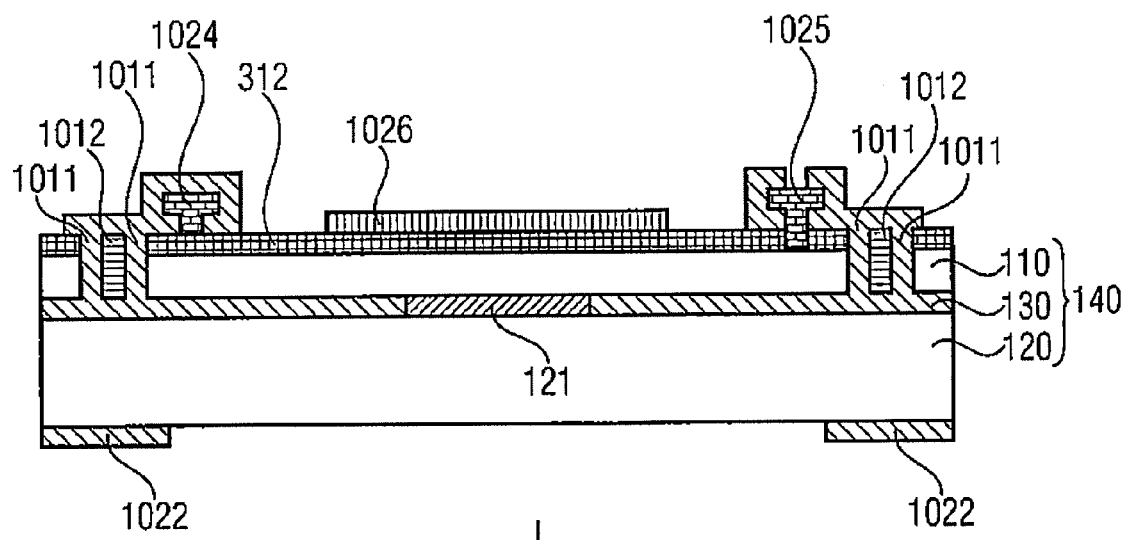
Figure 3B:
Figure 3C:
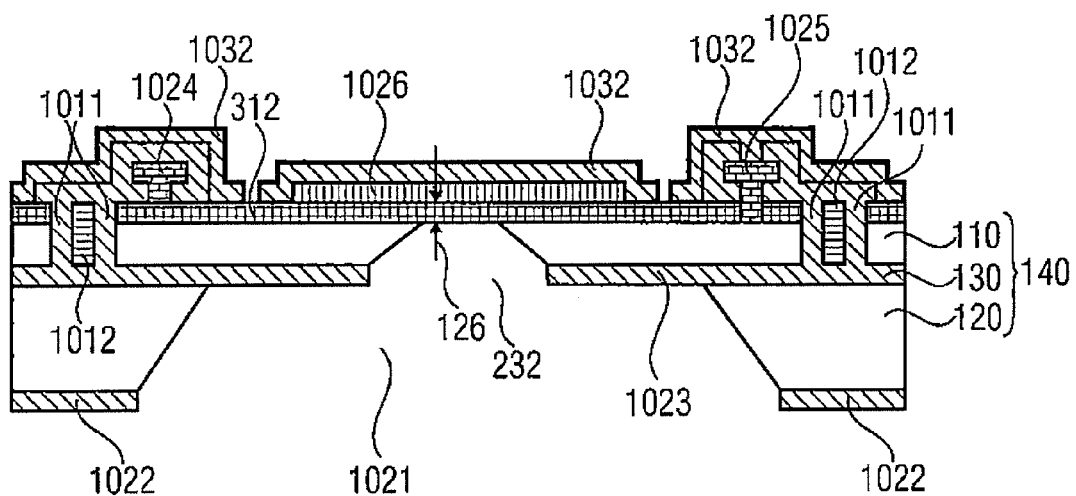
Figure 3D:
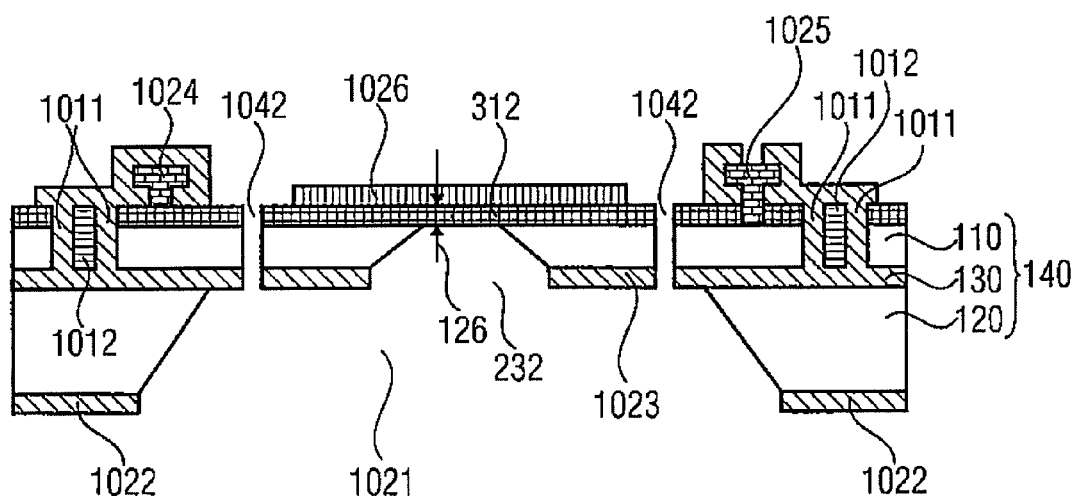

FIGS. 1(A) and 1(B) show a schematic illustration of a method 100 for structuring a device layer 110 of a substrate 140 according to an embodiment of the invention. The method 100 provides a possibility for structuring the device layer 110 of the substrate 140, wherein the substrate 140 comprises a carrier layer 120, the device layer 110 and an intermediate layer 130 disposed between the carrier layer 120 and the device layer 110. Thereby, the intermediate layer 130 is structured for exposing, at least in one portion 121, a first surface 122 of the carrier layer 120 facing the device layer 110. Starting from this substrate structure, beginning from a second surface 124 of the carrier layer 120 opposing the first surface 122, the thickness of the device layer 110 is reduced to a predetermined thickness 126 at a position 121 where the intermediate layer 130 is removed, wherein the second surface 124 of the carrier layer 120 comprises a mask 122 for defining the area where, for example, etching is performed.

The intermediate layer 130 is already pre-structured during the production of the substrate 140. This pre-structured substrate 140 as shown in FIG. 1(A) then offers the possibility to reduce the thickness of the device layer 110 from the back side (the side of the carrier layer 120 facing away from the device layer 110), as is shown in FIG. 1(B).

Thereby, for example, lithography problems occurring due to the loss of planarity by removing the carrier layer 120 can be avoided, since the mask for structuring the thickness of the device layer 110 already exists due to the pre-structured intermediate layer 130. Reducing the thickness of the device layer 110 can thus be performed in a simple manner.

Figure 10A:
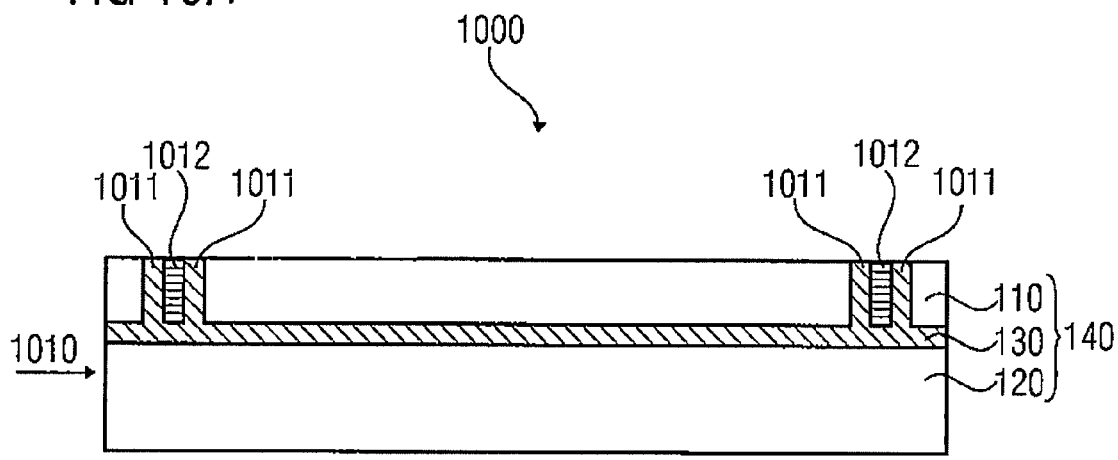
Figure 10B:
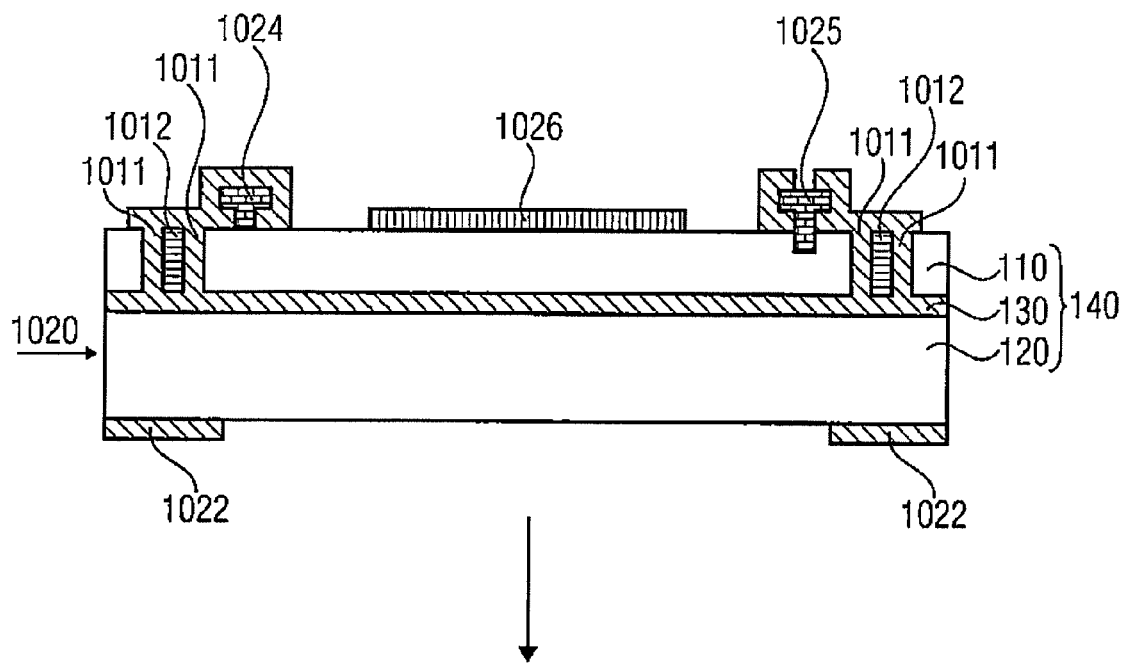
Figure 10D:
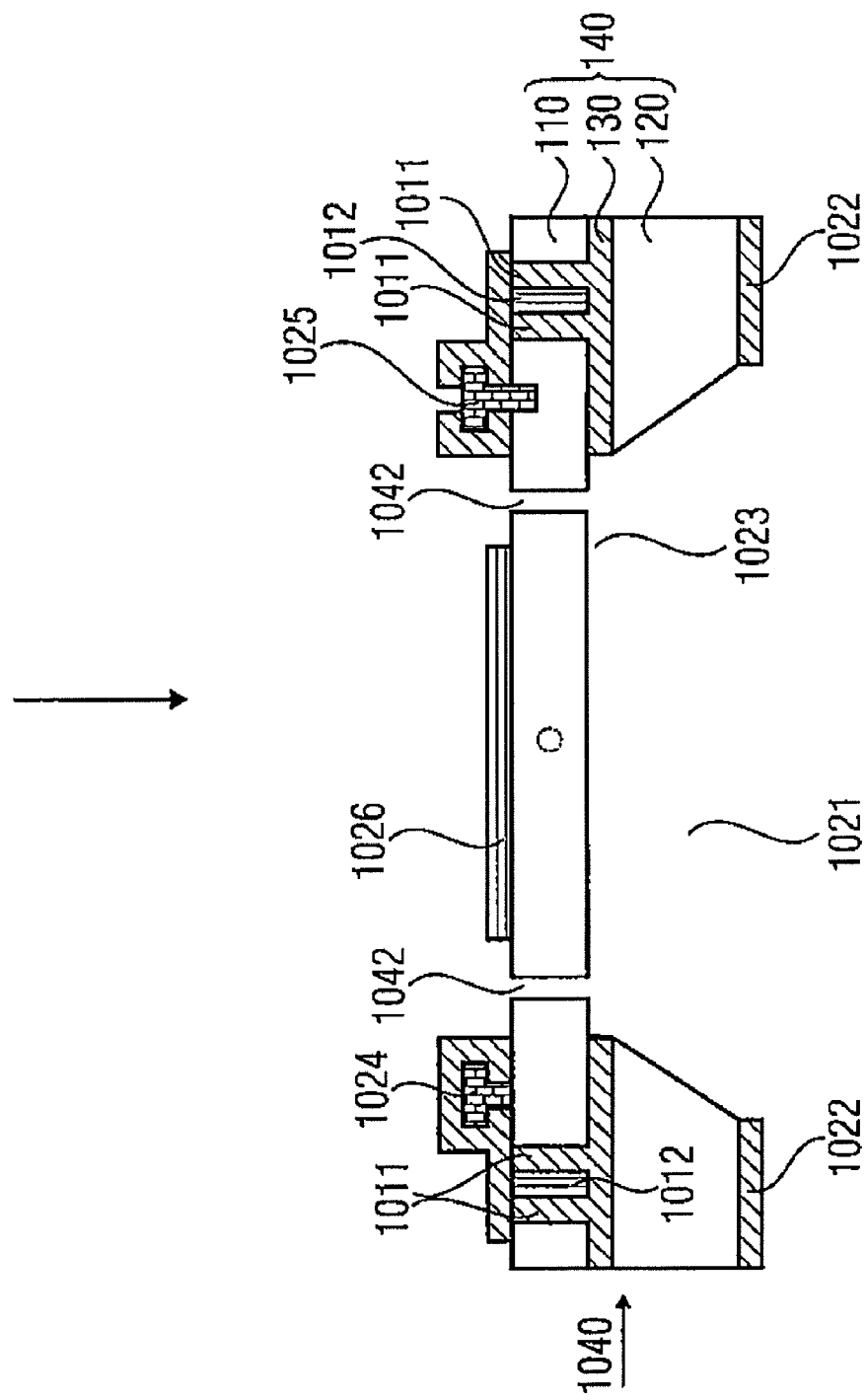

FIGS. 2(A)-(D) show a schematic illustration of a method 200 for producing a micromechanical structure corresponding to an embodiment of the invention. The method 200 is similar to the method shown in FIG. 10 and the same elements are provided with the same reference numerals. Unlike in FIG. 10, according to the invention, a substrate 140 having a pre-structured intermediate layer 130 is used. Thereby, during the third process step 1030 of the method shown in FIG. 10, etching 1021 the carrier layer 120 can be extended, so that at those positions 121 where the intermediate layer 130 is removed, the device layer 110 is reduced in the same processing step (as shown at reference numeral 232), as shown in the third process step 230 of the method 200. Thus, the physical properties of the micromechanical structure cannot only be adapted to the requirements in two dimensions, such as length and width, but also by the thickness of the device layer 110. The thickness of the device layer 110 can, for example, be adjusted by the duration of etching. As shown in method 1000, the substrate 140 can be, for example, a BSOI wafer. The layers of the substrate 140 can also consist of other materials.

FIGS. 3(A)-(D) show a schematic illustration of a method 300 for producing a micromechanical structure, wherein the device layer 110 comprises an integrated stop layer 312 corresponding to an embodiment of the invention. Largely, the method 300 corresponds to the above-described method 200. However, a stop layer 312, which defines the predetermined thickness of the device layer 110, is integrated in or on the device layer 110. The predetermined thickness of the device layer 110 is defined, since etching after removing 1021 the carrier layer 120, when reducing 232 the thickness of the device layer 110, ends when reaching the stop layer 312 or is decelerated so much, respectively, that the thickness of the device layer 110 does not change significantly with longer etching time. Thus, the duration of etching is uncritical. The stop layer 312 can have, for example, a layer with doped silicon. The stop layer can be limited locally to such areas where thinning is desired. As an alternative for integrating the stop layer into the device layer, the stop layer can also be deposited on the device layer.

Thus, the danger of reducing the thickness of the device layer 110 too much can be avoided by a simple additional process step in which the stop layer is produced.

Several embodiments according to the invention comprise producing a pre-structured substrate.

Figure 4A:
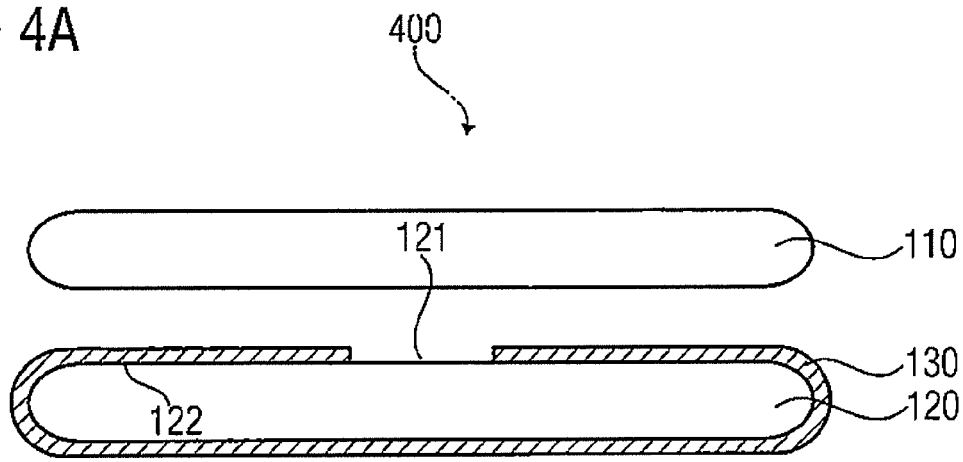
FIGS. 4(A)-(C) is a schematic illustration of a method for producing a pre-structured substrate.
Figure 4A:
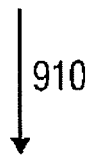
Figure 4B:
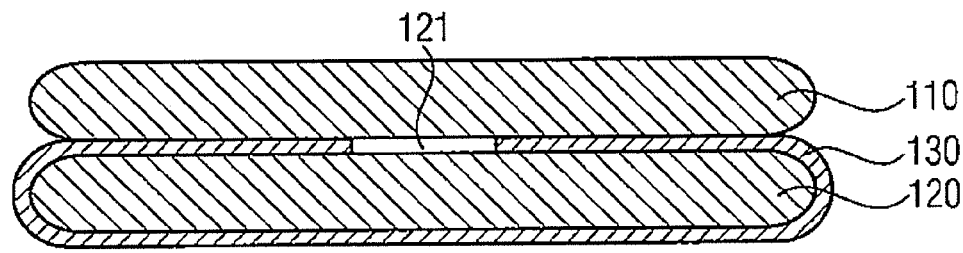
Figure 4B:
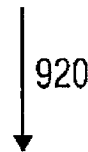
Figure 4C:
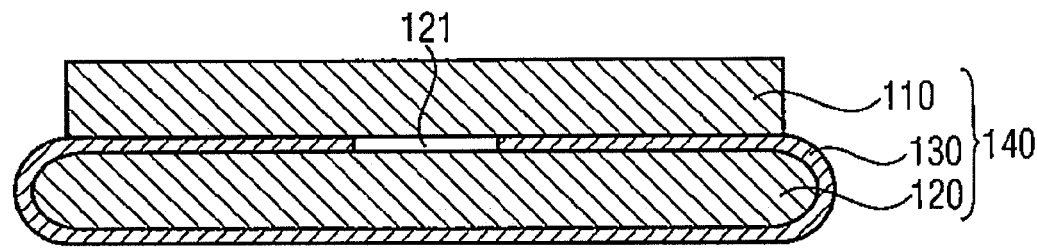
Figure 9A:
FIGS. 9(A)-(C) is a schematic illustration of a method for producing a BSOI wafer.
Figure 9B:
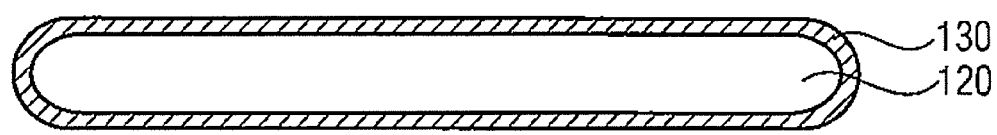
Figure 9C:
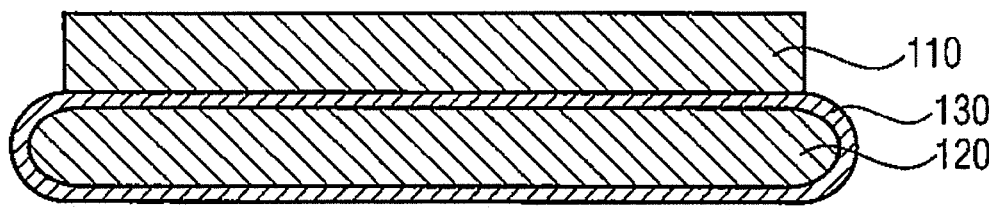

FIGS. 4(A)-(C) show a schematic illustration of a method 400 for producing a pre-structured substrate 140 as an embodiment according to the invention. The method 400 is similar to the method 900 shown in FIG. 9, and the same elements are provided with the same reference numerals. Unlike in FIG. 9, however, prior to connecting 910 to the device layer 110, the intermediate layer 130 disposed between the carrier layer 120 and the device layer 110 and located on the surface of the carrier layer 120 is structured at those positions 121 where the device layer 110 is to be reduced later, such that the surface 122 of the carrier layer 120 is exposed at those positions 121. The materials used for the individual layers of the substrate 140 do not have to be the same as those described for the substrate of method 900.

Figure 5A:
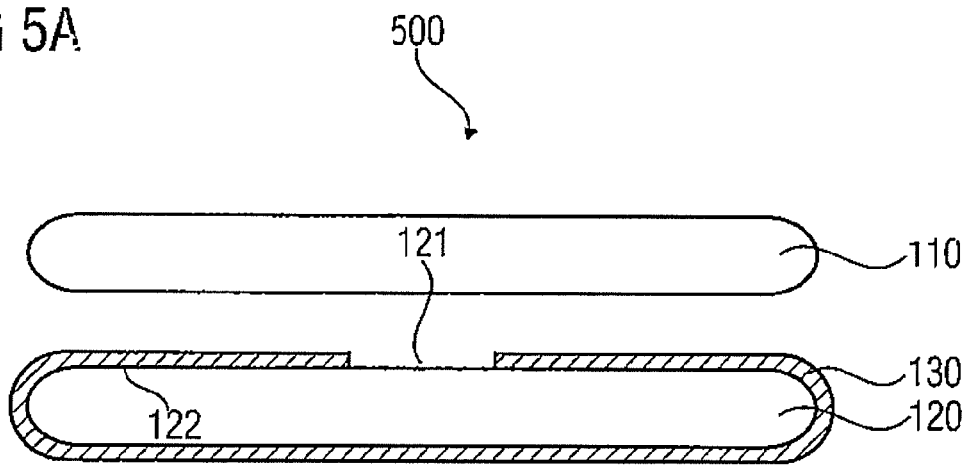
FIGS. 5(A)-(C) is a schematic illustration of a method for producing a pre-structured substrate, wherein the surface of the device layer comprises an additional layer.
Figure 5B:
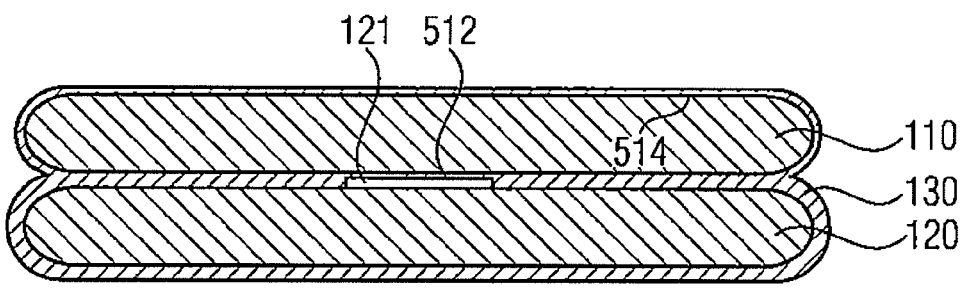
Figure 5C:
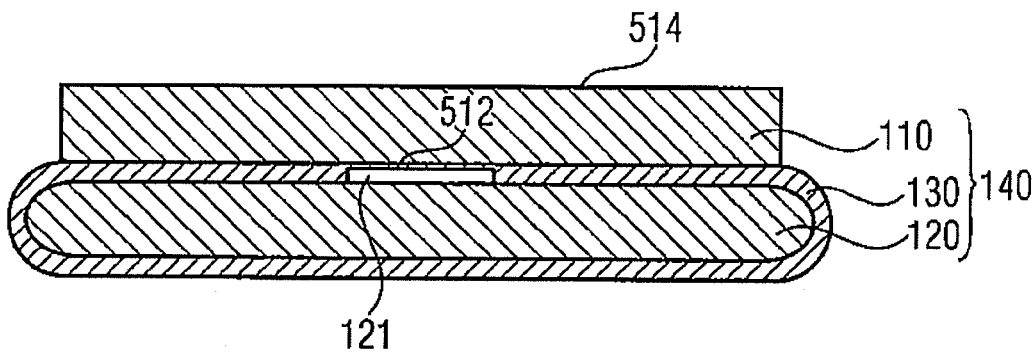

FIGS. 5(A)-(C) show a schematic illustration of a method 500 for producing a pre-structured substrate 140, wherein the surface of the device layer 110 has an additional layer 512 corresponding to an embodiment of the invention. The method 500 is similar to the method shown in FIG. 4 and the same elements are provided with the same reference numerals. However, prior to connecting 910 the carrier layer 120, on the surface 122 of which a pre-structured intermediate layer exists, and the device layer 110 on the surface of the device layer 110, an additional layer 512 is produced which is effective as an etch stop with regard to the material of the carrier layer 120. After connecting 910, the additional layer 512 on the surface 514 of the device layer 110 facing away from the carrier layer 120 is removed again, which is shown in FIG. 5c. The materials used for the individual layers of the substrate 140 do not have to be the same as for the substrate of method 900.

Figure 6A:
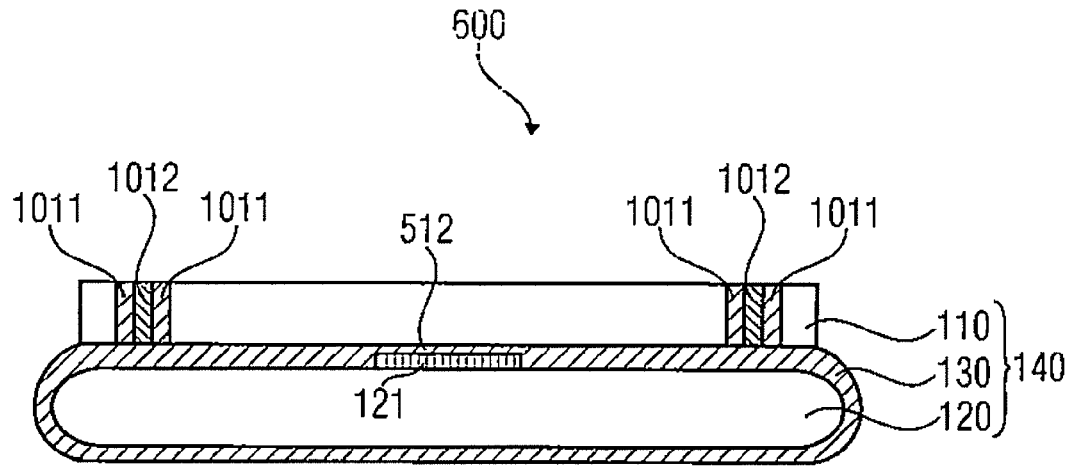
FIG. 6(A)-(D) is a schematic illustration of a method for producing a micromechanical structure, wherein the surface of the device layer comprises an additional layer at least in one area.
Figure 6B:
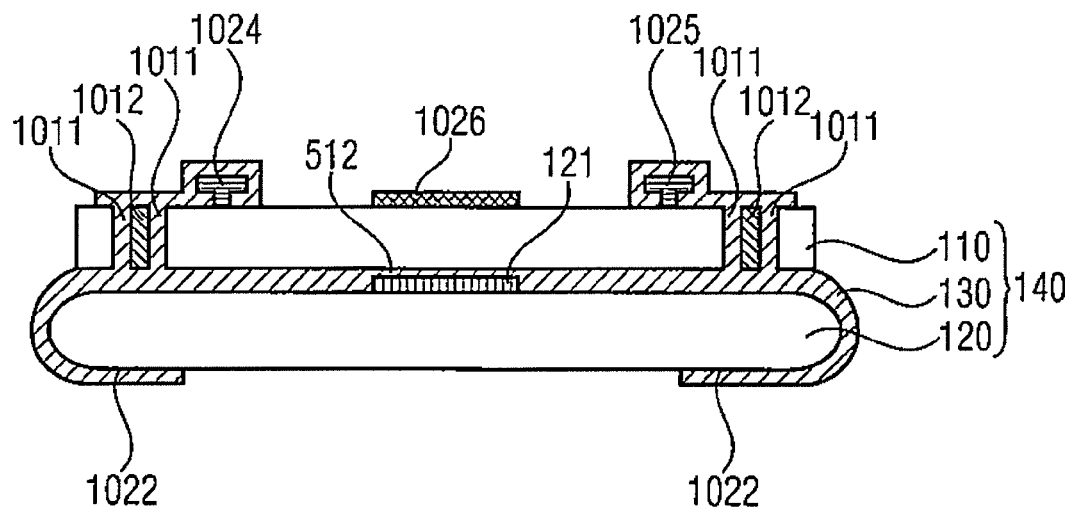
Figure 6C:
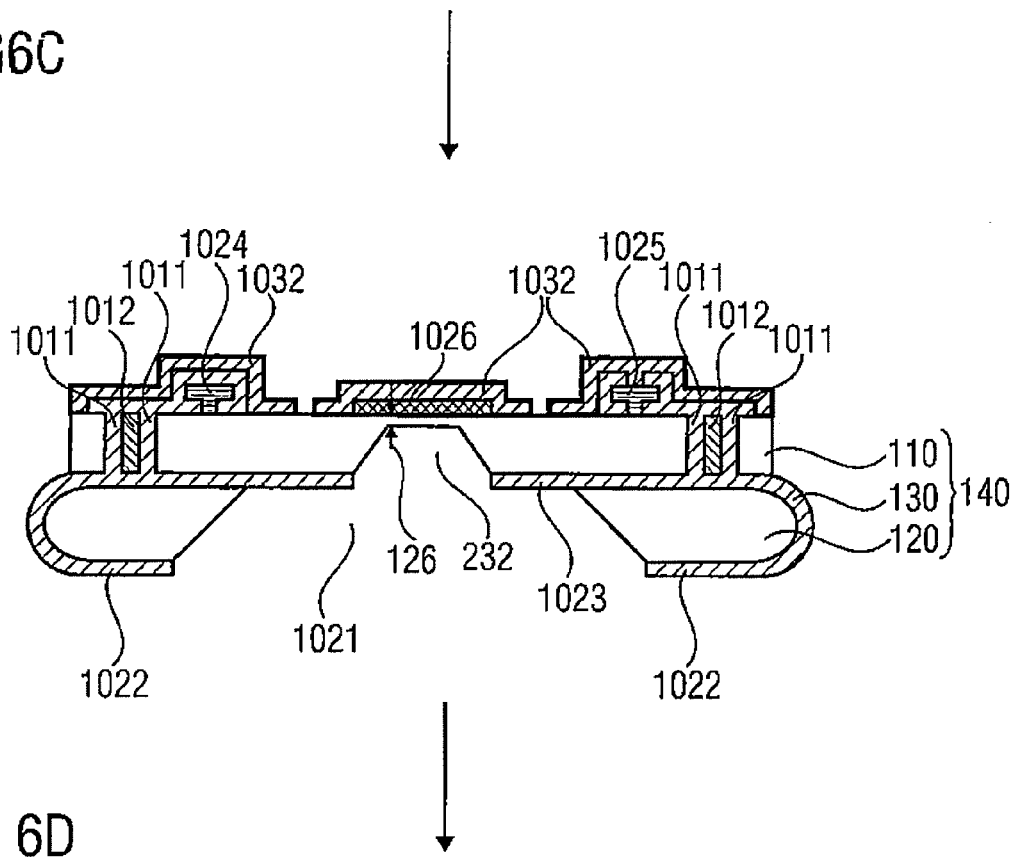
Figure 6D:
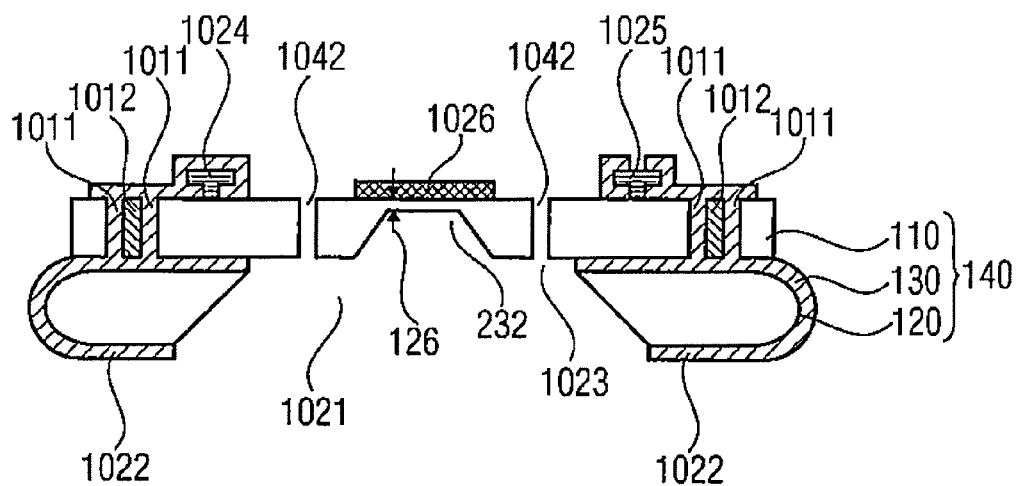

FIGS. 6(A)-(D) show a schematic illustration of a method 600 for producing a micromechanical structure, wherein the surface of the device layer 110 comprises, at least in one area, an additional layer 512 according to an embodiment of the invention. A substrate 140 is used for this method 600, wherein, at least in one area of the surface of the device layer 110 facing the carrier layer 120, an additional layer 512 is disposed, which is effective as etch stop with regard to the material of the carrier layer 120. This can be, for example, a substrate 140 produced according to the method 500. The production of the micromechanical structure or the micromechanical element, respectively, is similar to the method 200. Removing 1021 the carrier layer 120 and reducing 232 the thickness of the device layer 110 cannot be performed in one processing step in this method 600 due to the additional layer 512. First, the carrier layer 120 is removed at the positions defined by the backside mask 1022. Then, the additional layer 512 is removed on the surface of the device layer 110 and finally the thickness of the device layer 110 is reduced to the predetermined thickness 126, which is shown in FIG. 6(C). The method 600 can, for example, be used when the homogeneity of the etching 1021 of the carrier layer 120 is to be improved across the whole substrate area. This homogeneity improvement of etching is obtained by the etch stop at the additional layer 512, whereby a longer etching period when removing 1021 the carrier layer 120 becomes uncritical. Compared to the intermediate layer 130, the additional layer 512 is thinner, such that etching through the additional layer 512 does not completely remove the intermediate layer 130. The ratio of the thickness of the intermediate layer 130 to the thickness of the additional layer 512 is, for example, 1000:50.

Figure 7:
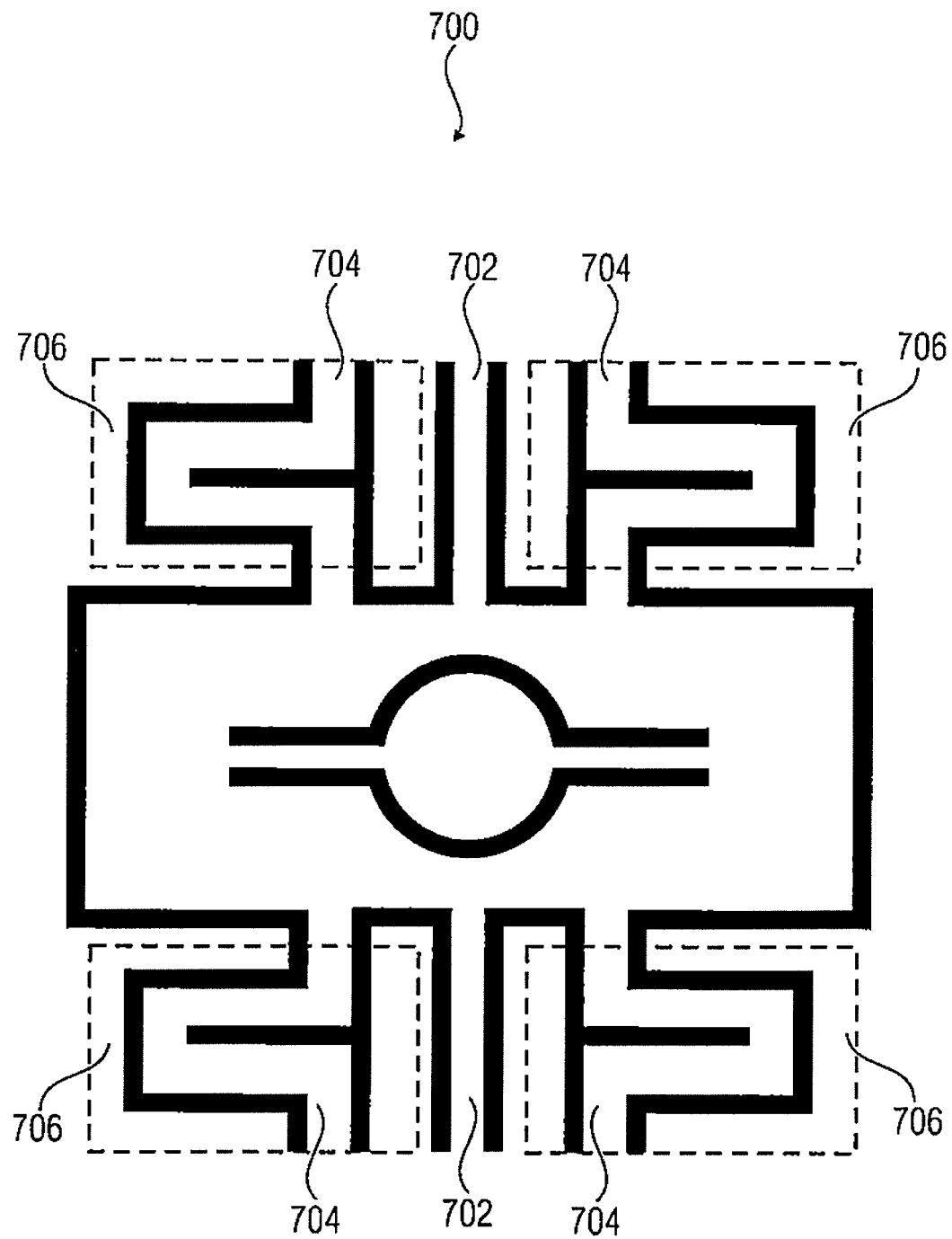
FIG. 7 is a schematic plan illustration of a two-dimensional scanner having torsion springs and thinned potential leads.

FIG. 7 shows a schematic plan illustration of a two-dimensional scanner 700 with torsion springs 702 and a thinned potential lead 704 corresponding to an embodiment of the invention. The scanner 700 is structured in or on the device layer of the substrate and comprises two opposing beams 702 serving as torsion springs, at least one, for example meandering, potential lead 704 is arranged on both sides adjacent to each of the two beams. The scanner is suspended at the two beams 702 forming the torsion spring and at the four potential leads 704. However, the four meandering potential leads 704 are in an area 706 with a reduced device layer thickness. Thereby, the physical properties of the scanner, such as the natural frequency, are determined mainly by the beams 702 of the torsion spring. It follows that the apparatus 700 behaves almost identically to an apparatus having no potential leads 704. By reducing the thickness of the device layer in certain areas 706, an apparatus can be produced, for example, that has one or several potential leads 704 apart from a torsion spring and still has the advantage that the mechanical properties (e.g. the natural frequency) are determined largely by the torsion spring.

Another advantage of the method is that trenches with different steps (depths) or a gradual depth course can be generated in a single etching step.

Figure 8:
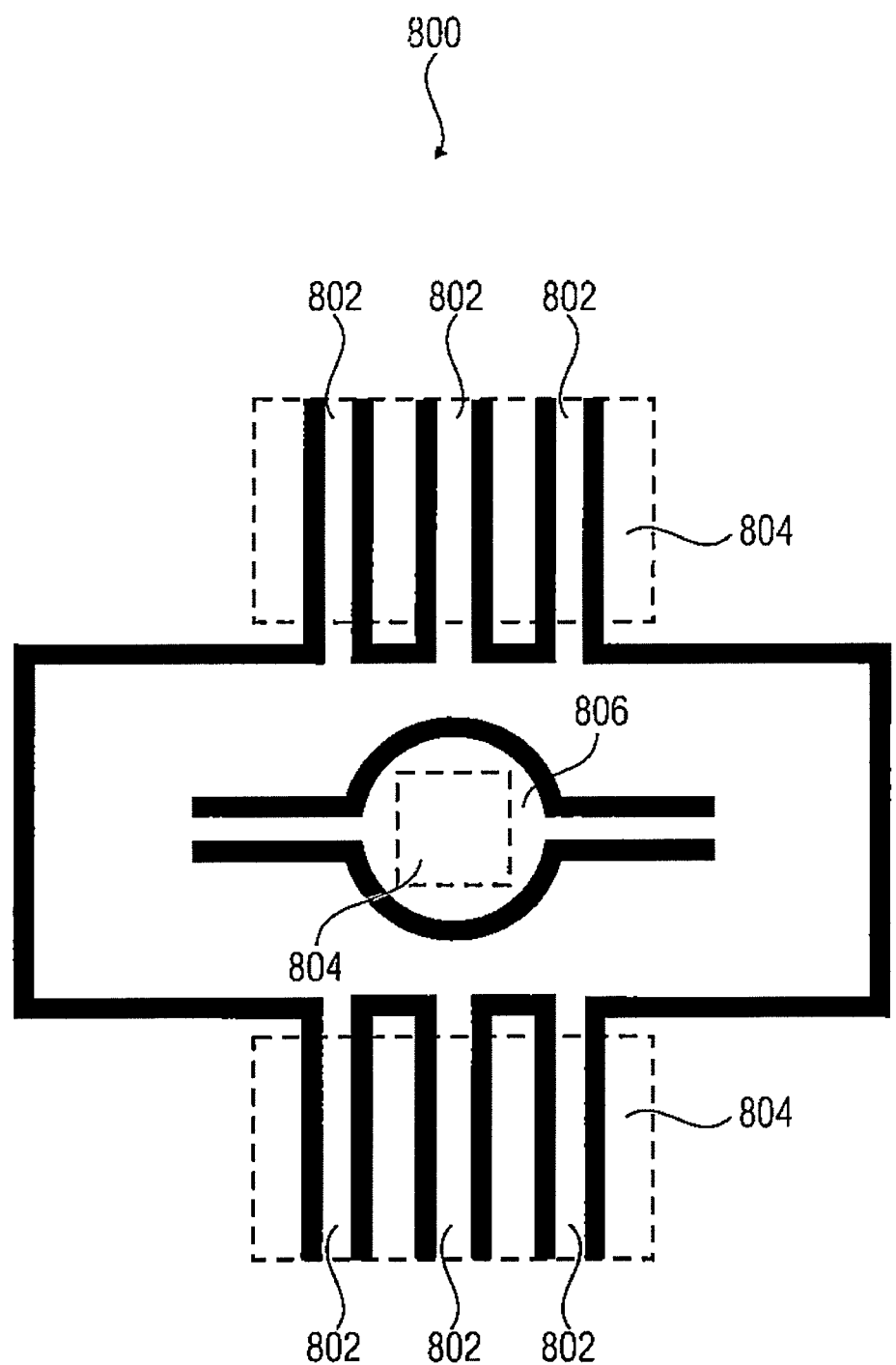
FIG. 8 is a schematic plan illustration of a two-dimensional scanner having thinned torsion springs or translation springs as well as a thinned mirror for increasing the mirror resonance frequency.

FIG. 8 shows a schematic plan illustration of a two-dimensional scanner 800 with thinned torsion springs or translation springs (and potential leads) as well as a thinned mirror for increasing the mirror resonance frequency, corresponding to an embodiment of the invention. The scanner 800 comprises three beams 802 each on two opposing sides that together determine the direction and properties of the torsion spring and can additionally serve as potential leads. Further, a mirror 806 is disposed in the middle of the scanner. The six beams and at least part of the mirror are in areas 804 with a reduced device layer thickness for increasing the mirror resonance frequency, for example. The scanner is suspended by the beams 802, wherein the number of beams 802 do not have to correspond to six beams, but can also be more or less. Further, not all beams 802 have to be in an area 804 with reduced device layer thickness. The physical properties of the scanner can be adapted to the respective requirements by varying the thickness of the device layer, as well as by varying the areas 804 where the thickness of the device layer is reduced.

In several embodiments according to the invention, a micromechanical structure can be produced by using a prestructured BSOI wafer having a structured BOX as a mask at the positions. Later, the mask can be removed automatically when removing the BOX.

In several embodiments according to the invention, such wafers allow a method for locally etching back the device layer from the backside, wherein the front and backsides do not have to be additionally processed and provided with a mask. This can be performed, for example, simply by extending an already used wet etching in TMAH. Another possibility is, for example, plasma etching which is combined, however, with a front-side contact in the etch chamber.

Further embodiments according to the invention allow utilization of the third dimension or a variation of the thickness of the device layer, respectively, for adjusting physical properties such as the mass, the rigidities, the thermal capacities, the layer tensions, the dynamical properties or the electrical resistances.

In several embodiments according to the invention, the geometrical limitation of the layer thickness to be defined results, for example, by temporarily etching at a constant and well-controllable etch rate, by an etch stop by optical end point control that can be performed, for example, interferometrically, or by limitation with a stop layer integrated in the device layer. Here, the stop layer can, for example, be effective in an electrochemical, chemical or "self-stopping" manner. An electrochemically effective stop layer can be made, for example, by a dopant step, a dopant gradient or a dopant change (P/N). Thereby, the etch stop can be supported by applying different electric potentials to the stop layer and the device layer. A chemically effective stop layer can, for example, be obtained by making the stop layer of a material with higher selectivity, such as silicon dioxide to silicon. Further, in anisotropic etching, there is the possibility to produce a "self-stopping" stop layer, such as a zone with high doping in the device layer or a 111 level on the surface of the device layer.

Generally, it has to be noted that the terms stop layer and etch stop do not only include a complete stop of etching or reducing the thickness of a device layer, but can also mean a strong deceleration of etching or reduction of the thickness of the device layer, so that the thickness of the device layer does not change significantly with longer process duration.

Further embodiments according to the invention comprise elements to be thinned or elements in areas with reduced device layer thickness, such as springs (torsion, bending), leads or potential leads, thermal, piezoelectric and other actuators (e.g. by using layers stacks) or elements causing a change of a vibration mass.

Several embodiments according to the invention comprise microelements, such as scanner mirrors, translation mirrors (e.g. phase shifters) or focussing elements (e.g. optical actuators) of a resonant or quasi-static type.

Further embodiments according to the invention comprise a scanner mirror with a simple torsion spring (of the height of the device layer) and several silicon structures parallel to this axis (thinned from the back side or with a reduced device layer thickness). Thereby, the resonance frequency is dominated by the torsion spring and the thinned structures, or structures with a reduced device layer thickness, respectively, serve for supplying electrical potentials without significantly influencing the frequency, which allows a very low resonance frequency with a simultaneous supply of several potentials, such as for sensors. The lead structures can be straight or, for example, meander-shaped for reducing rigidity and the torsion spring can also be used for leading. The mechanical suspension of the scanner can basically be realized by several parallel thinned structures. The thinned structures can operate as conductors and/or carriers of a conductor trace.

Several embodiments of the invention can have the advantage of a simple process control.

Further embodiments of the invention can have the advantage that they use already existing processes without changing the process control. Only a slight change of the wafer production is necessitated.

Several embodiments of the invention can have the advantage that the layer thicknesses can be adjusted exactly. This can happen, for example, partly in a "self-stopping" manner.

Further embodiments according to the invention comprise thinned springs, electrical leads or grounds.

Several embodiments according to the invention comprise a device layer and a carrier layer of monosilicon, isolating trenches filled with polysilicon, an intermediate layer of silicon dioxide, conductive traces and bondpads of an aluminum-silicon-copper alloy and a mirror of aluminum.

Embodiments of the invention relate to the realization of

Microsystems for data acquisition (e.g. 1D scanners, 2D scanners, microscopy),

Microsystems for data output (e.g. laser displays, laser projectors, laser printers, illuminators), microsystems for optical path manipulation (e.g. spectrometers, path length modulation), pressure, acceleration and viscosity sensors, or micromechanical gear elements necessitating a two-stage implementation (e.g. gear wheels or clock anchors for the clock industry).

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Method for structuring a device layer of a substrate, wherein the substrate is a silicon-on-insulator-substrate comprising a carrier layer, the device layer and an intermediate layer disposed between the carrier layer and the device layer, wherein the device layer is the silicon-on-insulator-layer of the substrate and the intermediate layer is a dielectric intermediate layer, and wherein the intermediate layer is prestructured for exposing, at least in one portion, a first surface of the carrier layer facing the device layer, wherein, starting from a second surface of the carrier layer opposing the first surface, the thickness of the device layer is reduced to a predetermined thickness at those positions where the intermediate layer is removed.

2. The method according to claim 1, wherein the reducing comprises etching.

3. The method according to claim 2, wherein the intermediate layer is implemented as an etch stop with regard to the materials of the carrier layer and the device layer.

4. The method according to claim 2, wherein the predetermined thickness of the device layer is adjusted by the duration of etching.

5. The method according to claim 2, wherein, during the step of reducing, the thickness of the device layer is monitored by optical end point control, wherein reducing is terminated when the predetermined thickness is reached.

6. The method according to claim 2, wherein the device layer comprises a stop layer integrated in the device layer or deposited on the device layer, which defines the predetermined thickness of the device layer.

7. The method according to claim 6, wherein the stop layer and the device layer comprise different dopant concentrations.

8. The method according to claim 6, wherein the dopant concentration between the device layer and the stop layer changes in steps or continuously, or wherein the different dopant concentrations are selected for defining a pn transition.

9. The method according to claim 6, wherein different electrical potentials are applied to the device layer and to the stop layer.

10. The method according to claim 6, wherein the stop layer comprises a different material than the device layer.

11. The method according to claim 6, wherein the stop layer arranged on the device layer comprises a different crystal structure or crystal orientation than the device layer.

12. The method according to claim 1, wherein removing the carrier layer is performed, in at least one portion, in one processing step with reducing the thickness of the device layer.

13. The method according to claim 1, wherein the device layer comprises, at least in one area opposing the first surface of the carrier layer, an additional layer which is effective as an etch stop with regard to the material of the carrier layer.

14. The method according to claim 13, wherein reducing comprises:
   etching the carrier layer until the additional layer is exposed;
   removing the additional layer on the surface of the device layer; and
   etching the device layer to the predetermined thickness.

15. The method according to claim 1, wherein the substrate is a BSOI wafer.

16. A method for producing a micromechanical structure, comprising:
   providing a silicon-on-insulator-substrate comprising a device layer, a carrier layer and an intermediate layer disposed between the device layer and the carrier layer, wherein the device layer is the silicon-on-insulator-layer of the substrate and the intermediate layer is an oxide intermediate layer, wherein the intermediate layer is prestructured for exposing, at least in one portion, a first surface of the carrier layer facing the device layer; and
   generating a micromechanical structure in the device layer of the substrate, wherein generating the micromechanical structure comprises reducing the thickness of the device layer to a predetermined thickness in at least one area of the micromechanical structure according to a method for structuring a device layer of a substrate, wherein the substrate comprises a carrier layer, the device layer and an intermediate layer disposed between the carrier layer and the device layer, and wherein the intermediate layer is structured for exposing, at least in one portion, a first surface of the carrier layer facing the device layer, wherein, starting from a second surface of the carrier layer opposing the first surface, the thickness of the device layer is reduced to a predetermined thickness at those positions where the intermediate layer is removed.

17. Micromechanical structure, comprising:
   a silicon-on-insulator-substrate comprising a device layer, a carrier layer and an intermediate layer disposed between the device layer and the carrier layer, wherein the device layer is the silicon-on-insulator-layer of the substrate and the intermediate layer is an oxide intermediate layer, wherein the intermediate layer is prestructured for exposing, at least in one portion, a first surface of the carrier layer facing the device layer; and
   at least one portion in the area of the micromechanical structure, wherein the thickness of the device layer is reduced according to a method for structuring a device layer of a substrate, wherein the substrate comprises a carrier layer, the device layer and an intermediate layer disposed between the carrier layer and the device layer, and wherein the intermediate layer is structured for exposing, at least in one portion, a first surface of the carrier layer facing the device layer, wherein, starting from a second surface of the carrier layer opposing the first surface, the thickness of the device layer is reduced to a predetermined thickness at those positions where the intermediate layer is removed.

18. The micromechanical structure according to claim 17, wherein the thickness of the device layer is reduced in at least one portion for influencing the resonance frequency of the micromechanical structure.

19. The micromechanical structure according to claim 17, which is a two-dimensional scanner mirror and comprises at least one electrically conductive lead adjacent to a torsion spring of the scanner mirror, which is structured in or on a portion with reduced device layer thickness.

20. The micromechanical structure according to claim 17, which is a two-dimensional scanner mirror, wherein all torsion springs and potential leads as well as at least part of the mirrored areas are structured in a portion with reduced device layer thickness.

21. The micromechanical structure according to claim 17 for a microsystem for data acquisition, a microsystem for data output, a microsystem for optical path manipulation, a pressure, acceleration or viscosity sensor or a micromechanical gear element.

* * * * *